(12) United States Patent
Hammerschmidt

(10) Patent No.: US 11,443,992 B2
(45) Date of Patent: Sep. 13, 2022

(54) PRESSURE SENSORS ON FLEXIBLE SUBSTRATES FOR STRESS DECOUPLING

(71) Applicant: Infineon Technologies AG, Neubiberg (DE)

(72) Inventor: Dirk Hammerschmidt, Finkenstein (AT)

(73) Assignee: Infineon Technologies AG

( * ) Notice: Subject to any disclaimer, the term of this patent is extended or adjusted under 35 U.S.C. 154(b) by 25 days.

(21) Appl. No.: 17/143,332

(22) Filed: Jan. 7, 2021

(65) Prior Publication Data

US 2021/0134688 A1    May 6, 2021

Related U.S. Application Data

(63) Continuation of application No. 16/910,595, filed on Jun. 24, 2020, now Pat. No. 10,910,283, which is a continuation of application No. 16/294,208, filed on Mar. 6, 2019, now Pat. No. 10,777,474.

(51) Int. Cl.
| | |
|---|---|
| *H01L 23/29* | (2006.01) |
| *H01L 21/00* | (2006.01) |
| *H01L 23/053* | (2006.01) |

(52) U.S. Cl.
CPC .... *H01L 23/053* (2013.01); *B81B 2201/0264* (2013.01)

(58) Field of Classification Search
CPC ............. H01L 23/053; H01L 31/03926; B81B 1/00325; B81B 7/02; B81B 2201/0264
USPC .......... 438/52, 112, 127; 257/254, 417, 687, 257/788
See application file for complete search history.

(56) References Cited

U.S. PATENT DOCUMENTS

| | | | |
|---|---|---|---|
| 5,825,091 A | 10/1998 | Adams | |
| 6,869,825 B2* | 3/2005 | Chiu | H01L 23/5387 438/106 |
| 7,843,021 B2* | 11/2010 | Zhe | H01L 25/165 257/416 |
| 9,360,318 B1* | 6/2016 | Pun | G01C 19/5783 |
| 10,777,474 B1* | 9/2020 | Hammerschmidt | B81B 7/0054 257/788 |

(Continued)

FOREIGN PATENT DOCUMENTS

| | | |
|---|---|---|
| DE | 19804748 A1 | 10/1998 |
| WO | 2017194417 A1 | 11/2017 |

*Primary Examiner* — Calvin Lee
(74) *Attorney, Agent, or Firm* — Design IP

(57) ABSTRACT

A semiconductor device includes a semiconductor chip including a substrate and a MEMS element, wherein the substrate includes a surface, and wherein the MEMS element is disposed at the surface of the substrate and the MEMS element includes a sensitive area; a first electrical interconnect structure electrically connected to the surface of the substrate; a carrier electrically connected to the first electrical interconnect structure; and a first stress relieve spring entrenched in the carrier, wherein the first stress relieve spring is a single integral channel that comprises two parallel channels that join together at a periphery of the first electrical interconnect structure to form the single integral channel that wraps around a portion of the periphery of the first electrical interconnect structure, wherein the two parallel channels extend outward, in parallel, from the periphery of the first electrical interconnect structure to a first termination region of the carrier.

20 Claims, 4 Drawing Sheets

(56) References Cited

U.S. PATENT DOCUMENTS

| | | | |
|---|---|---|---|
| 10,910,283 B2* | 2/2021 | Hammerschmidt | B81B 7/0054 |
| | | | 438/127 |
| 2004/0124527 A1 | 7/2004 | Chiu | |
| 2006/0223227 A1* | 10/2006 | Kubota | H05K 1/189 |
| | | | 438/106 |
| 2009/0218668 A1 | 9/2009 | Zhe et al. | |
| 2015/0353345 A1 | 12/2015 | Heuck et al. | |

* cited by examiner

PRESSURE SENSORS ON FLEXIBLE SUBSTRATES FOR STRESS DECOUPLING

CROSS-REFERENCE TO RELATED APPLICATIONS

This application is a continuation of U.S. patent application Ser. No. 16/910,595 filed on Jun. 24, 2020, now U.S. Pat. No. 10,910,283 issued Feb. 2, 2021, which is a continuation of U.S. patent application Ser. No. 16/294,208 filed Mar. 6, 2019, now U.S. Pat. No. 10,777,474 issued Sep. 15, 2020, which are incorporated by reference as if fully set forth.

FIELD

The present disclosure relates generally to semiconductor devices and a method of manufacturing the same, and, more particularly, microelectromechanical systems (MEMS) elements with a stress relief mechanism.

BACKGROUND

Microelectromechanical system (MEMS) are microscopic devices, particularly those with moving parts. MEMS became practical once they could be fabricated using modified semiconductor device fabrication technologies, normally used to make electronics. Thus, a MEMS may be built into a substrate as a component of an integrated circuit, that is diced into a semiconductor chip that is subsequently mounted in a package.

Mechanical stress and other external mechanical influences introduced to a package may inadvertently be transferred through the package to an integrated MEMS element, such as sensor, and, more particularly, to a pressure sensor. This transferred mechanical stress may affect the operation of the MEMS element or induce an shift (e.g., an offset) in a sensor signal that may lead to incorrect measurements.

For example, semiconductor pressure sensors have a pressure sensitive element arranged to measure an absolute pressure or a relative pressure (e.g. the difference between two pressures). A problem with many pressure sensors is that the sensor measures (or outputs, or gives) a signal, even in the absence of a pressure (or pressure difference) to be measured. This offset may be the result of mechanical stress and/or deformation of the housing (e.g., the packaging) of the sensor. The housing-stress/deformation will typically also cause a stress-component at the sensor surface where the sensitive elements (e.g., piezo-resistors) are located, and thereby cause an offset error, a linearity error, or even a hysteresis error to the output signal.

Therefore, an improved device capable of decoupling mechanical stress from an integrated MEMS element may be desirable.

SUMMARY

One or more embodiments provide a semiconductor device that includes a semiconductor chip including a substrate having a first surface and a second surface arranged opposite to the first surface; and a microelectromechanical systems (MEMS) element, including a sensitive area, disposed at the first surface of the substrate. The semiconductor device further includes at least one electrical interconnect structure electrically connected to the first surface of the substrate, and a flexible carrier electrically connected to the at least one electrical interconnect structure, where the flexible carrier wraps around the semiconductor chip and extends over the second surface of the substrate such that a folded cavity is formed around the semiconductor chip.

BRIEF DESCRIPTION OF THE DRAWINGS

Embodiments are described herein making reference to the appended drawings.

DETAILED DESCRIPTION

Figure 1:
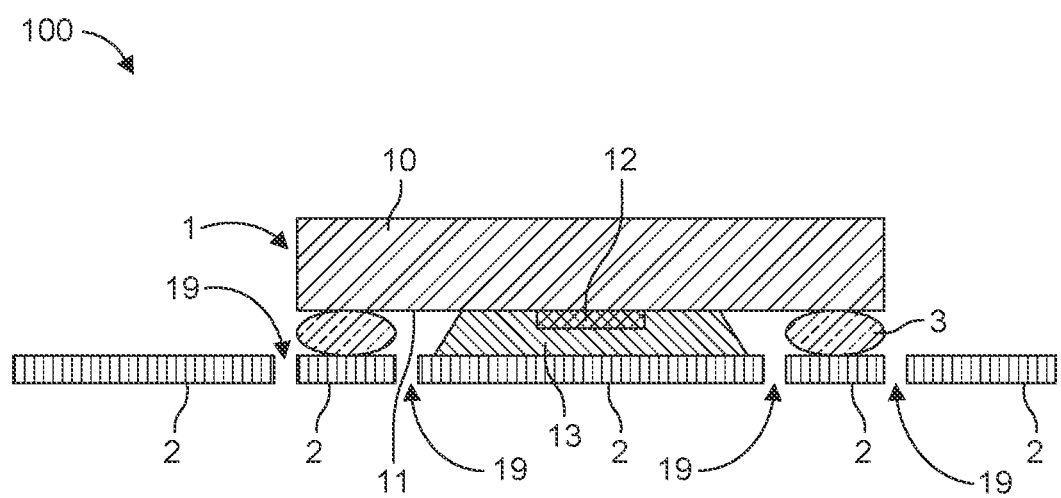
FIG. 1 shows a cross-sectional diagram of a pressure sensor package according to one or more embodiments.

In the following, various embodiments will be described in detail referring to the attached drawings, where like reference numerals refer to like elements throughout. It should be noted that these embodiments serve illustrative purposes only and are not to be construed as limiting. For example, while embodiments may be described as comprising a plurality of features or elements, this is not to be construed as indicating that all these features or elements are needed for implementing embodiments. Instead, in other embodiments, some of the features or elements may be omitted, or may be replaced by alternative features or elements. Additionally, further features or elements in addition to the ones explicitly shown and described may be provided, for example conventional components of sensor devices.

Features from different embodiments may be combined to form further embodiments, unless specifically noted otherwise. Variations or modifications described with respect to one of the embodiments may also be applicable to other embodiments. In some instances, well-known structures and devices are shown in block diagram form rather than in detail in order to avoid obscuring the embodiments.

Further, equivalent or like elements or elements with equivalent or like functionality are denoted in the following description with equivalent or like reference numerals. As the same or functionally equivalent elements are given the same reference numbers in the figures, a repeated description for elements provided with the same reference numbers may be omitted. Hence, descriptions provided for elements having the same or like reference numbers are mutually exchangeable.

In this regard, directional terminology, such as "top", "bottom", "front", "behind", "back", "leading", "trailing", "below", "above" etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope defined by the claims. The following detailed description, therefore, is not to be taken in a limiting sense.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

In embodiments described herein or shown in the drawings, any direct electrical connection or coupling, i.e., any connection or coupling without additional intervening elements, may also be implemented by an indirect connection or coupling, i.e., a connection or coupling with one or more additional intervening elements, or vice versa, as long as the general purpose of the connection or coupling, for example, to transmit a certain kind of signal or to transmit a certain kind of information, is essentially maintained. Features from different embodiments may be combined to form further embodiments. For example, variations or modifications described with respect to one of the embodiments may also be applicable to other embodiments unless noted to the contrary.

The term "substantially" may be used herein to account for small manufacturing tolerances (e.g., within 5%) that are deemed acceptable in the industry without departing from the aspects of the embodiments described herein.

Embodiments relate to microelectromechanical system (MEMS), and particularly to MEMS pressure sensors, integrated on a semiconductor chip and subsequently mounted to a package. The MEMS may be referred to as a MEMS element, a MEMS cell, or a MEMS device. The side or surface of the chip at which the MEMS element is provided may be referred to as a front side or front surface of the chip, whereas the side or surface of the chip opposite thereto may be referred to as a back side or a back surface of the chip.

The package is adapted to enable the MEMS pressure sensor to detect and/or measure a force imposed thereon. For example, the MEMS pressure sensor may operate as a transducer that generates an electrical signal as a function of the pressure imposed, and the package may have an opening formed in proximity to the MEMS pressure sensor that allows a medium to interact with the MEMS pressure sensor. The medium may be any pressure measurable or pressure inducing entity.

In general, a sensor, as used herein, may refer to a component which converts a physical quantity to be measured to an electric signal, for example a current signal or a voltage signal. The physical quantity may, for example, be pressure as an expression of force imposed on a sensitive area or region of the sensor. Chemicals, humidify, and debris, such as foreign particles, may negatively impact the performance of any sensor. Thus, it is desirable to prevent these and other potential contaminants from reaching the surface of the sensor, and, specifically, from reaching the sensitive area or region of the sensor.

A manufacturing process for semiconductor chip fabrication may include two sequential sub-processes commonly referred to as front-end and back-end production. The back-end production may further include two sequential sub-processes commonly referred to as pre-assembly and assembly.

Front-end production refers primarily to wafer fabrication. A wafer, as used herein, may also be referred to as a substrate. The front-end production may start with a clean disc-shaped silicon wafer that will ultimately become many silicon chips. First, a photomask that defines the circuit patterns for circuit elements (e.g., transistors) and interconnect layers may be created. This mask may then be laid on the clean silicon wafer and is used to map the circuit design. Transistors and other circuit elements may then be formed on the wafer through photolithography. Photolithography involves a series of steps in which a photosensitive material is deposited on the wafer and exposed to light through a patterned mask; unwanted exposed material is then etched away, leaving only the desired circuit pattern on the wafer. By stacking the various patterns, individual elements of the semiconductor chip may be defined. A MEMS device or MEMS element may also be incorporated onto and/or into the surface of the wafer and connected to one or more circuit elements. During the final phase of the front-end production process, each individual chip on the wafer is electrically tested to identify properly functioning chips for assembly.

Back-end production refers to the assembly and test of individual semiconductor devices or chips. The assembly process is intended to protect the chip, facilitate its integration into electronic systems, limit electrical interference and enable the dissipation of heat from the device. Once the front-end production process is complete, the wafer is sawed or diced into individual semiconductor chips. This dicing of the wafer into individual semiconductor chips is referred to as pre-assembly.

In an assembly phase of the back-end production, the semiconductor chips are incorporated into a package. For example, these semiconductor chips may be individually attached by means of an alloy or an adhesive to a lead frame, a metallic device used to connect the semiconductor to a circuit board. Leads on the lead frame may then be connected by aluminum or gold wires to the input/output terminals on the semiconductor chip through the use of automated machines known as wire bonders. Each semiconductor device may then be at least partially encapsulated in a plastic molding compound or a ceramic case, forming the package.

Thus, a MEMS element may be built into a substrate as a component of an integrated circuit, the substrate then being diced into semiconductor chips that are each subsequently mounted in a package.

It will be appreciated that while the pre-assembly (i.e., dicing) process may be described as part of the back-end production flow, the chips may be partially singulated during final phase of the front-end production. Thus, in some instances, pre-assembly may begin or may be performed during the front-end production.

According to one or more embodiments, mechanical stress-decoupling is provided to a MEMS element as a stress relief mechanism. A stress-decoupling feature such as one or more trenches (i.e., one or more stress-decoupling trenches) may be provided. In additionally, each stress-decoupling trench is filled with a gel (e.g., a silicone gel) and the gel may additionally be deposited on the MEMS element at the wafer level (i.e., during the front-end production process), or during or subsequent to the pre-assembly process, but prior to assembly (i.e., packaging). The protective material may be deposited on an exposed surface of the MEMS element such that an entire exposed surface of the MEMS element is covered by the protective material.

The exposed surface of the MEMS element may include or may be referred to as a sensitive area that enables the MEMS element to measure a physical quantity. For example, the MEMS element may be a MEMS pressure sensor that is configured to detect or measure a change in pressure in response to a change of force imposed on the exposed surface. The protective material is configured such that, when the MEMS element is covered by the protective material, a sensor functionality of the MEMS element remains intact. For example, the protective material may be a silicone gel that has a viscosity that permits a force exerted thereon to be transferred to the MEMS pressure sensor. Thus, the protective material is flexible enough that when the protective material is depressed, the sensitive area of the MEMS pressure sensor is also depressed proportionally.

More particularly, the protective material permits full sensor functionality of the MEMS element, including mechanical functionality and electrical functionality, while sealing an entire surface of the MEMS element. Even more particularly, the protective material is configured such that no functionality of the MEMS element is impeded by the protective material.

By ensuring that the functionality of the MEMS element remains intact, the protective material may be deposited onto the MEMS element as a permanent material at an early stage of the chip fabrication process. Thus, the MEMS element may already be configured in an operable state (e.g., a final operable state) at the time the protective material is deposited onto the MEMS element, and the protective material may remain completely intact after deposition, including throughout the assembly process, such that it remains a feature in the final product.

As a result of the early deposition of the protective material, the MEMS element is provided early particle and humidity protection from foreign matter that may have been introduced during (pre-)assembly processes that could influence the sensor performance.

While some embodiments provided herein may refer to the protective material as being silicone gel, the protective material is not limited thereto, and may be any material that provides protection from foreign matter while permitting sensor functionality of the MEMS element, and more particularly permits sensor functionality of the MEMS element at the time of deposition of the protective material. Thus, the protective material may be any material that behaves like a fluid in order to transfer applied pressure to a sensitive membrane of a pressure sensor.

Embodiments include a silicon die on which an MEMS element is integrated, where the silicon die has sufficiently low stress on the MEMS element. The silicon die can be a bare die or a chip size package (CSP) mounted on a flexible carrier that minimizes or prohibits the transfer of mechanical stress to the silicon die, and ultimately to the MEMS element, due to its low mechanical stiffness. The flexible carrier can be a foil printed circuit board (PCB) or a normal PCB with stress relieve structures, such as stress decoupling trenches, that enable the normal PCB to be flexible. Environmental protection is performed by a combination of a protective material (e.g., silicone gel) disposed around the MEMS element with the flexible carrier.

FIG. 1 shows a cross-sectional diagram of a pressure sensor package 100 according to one or more embodiments. The pressure sensor package 100 includes chip 1 bonded to a flexible carrier 2 by bonding balls 3. The chip 1 may be a bare die or a CSP. Thus, no molding is applied to the package 100 (e.g., to encapsulate the chip). The flexible carrier 2 may be a foil PCB or a normal PCB with stress relieve structures, such as stress decoupling trenches, that enable the normal PCB to be flexible. Thus, the flexible carrier 2 may be referred to as a stress decoupling carrier or substrate. Furthermore, while bonding balls are used in the described examples, it will be appreciated that any electrical interconnect structure may be used to provide contact between the chip 1 and the flexible carrier 2.

The chip 1 is an integrated circuit (IC) that includes a semiconductor substrate 10 (e.g., a silicon substrate) having a main surface 11 on the front side of the chip 1 and a MEMS element 12 provided at the main surface 11. The main surface 11 may be referred to as an active chip surface that includes additional circuitry that interfaces with the MEMS element 12. The bonding balls 3 are coupled to a pad on the main surface 11 of the chip 1 and to the flexible carrier 2, and is used for carrying electrical signals therebetween. In this arrangement, the chip 1 is assembled face down on the flexible carrier 2 such that a sensitive area of the MEMS element 12 faces towards the flexible carrier.

The MEMS element 12 is a pressure sensor arranged at the main surface 11 such that the MEMS element 12 is capable of sensing a change in pressure applied thereto. Thus, the MEMS element 12 includes a sensitive area that either protrudes from the main surface 11 and/or is located in an opening of the main surface 11 in which the sensitive area resides. The MEMS may also utilize a backside processing of the silicon die (e.g., bulk micro machining or die bonding with other wafers).

The pressure sensor package 100 further includes a flexible protective material 13, such as silicone gel, disposed and coupled between the MEMS element 12 and the flexible carrier 2. The flexible protective material 13 may be placed such that an entire exposed surface of the MEMS element 12, including the sensitive area, is encapsulated by the flexible protective material 13. Thus, the flexible protective material 13 is placed at least in the region where the MEMS element 12 is located, and the flexible protective material 13 is used to fill the gap the MEMS element 12 and the flexible carrier 2. By this arrangement, pressure may be applied to the flexible carrier 2 such that it is transferred through the flexible protective material 13 to the MEMS element 12. Additionally, pressure applied directly to the protective material 13 is transferred through the flexible protective material 13 to the MEMS element 12, such that the flexible carrier 2 does not influence the measurement. This direct application of pressure to the protective material 13 may be achieved at one or more of the slits or openings 19 that extend through the flexible carrier 2, or at any other region where the protective material 13 is exposed to the ambient.

As shown, the flexible protective material 13 is further bonded to at least a portion of the main surface 11 of the chip 1. Thus, the flexible protective material 13 completely fills the gap between the main surface 11, including the MEMS element 12, and the flexible carrier 2.

The flexible carrier 2 may also include a plurality of slits or openings 19 that may increase the flexibility of the carrier 2 and also reduce the amount of mechanical stress transferred to the inner region of the carrier where the MEMS element is bonded thereto. For example, the slits 19 may be located in proximity of the bonding balls 3. In some cases, the slits 19 may surround a periphery of the bonding balls 3 in a circular pattern.

Figure 2A:
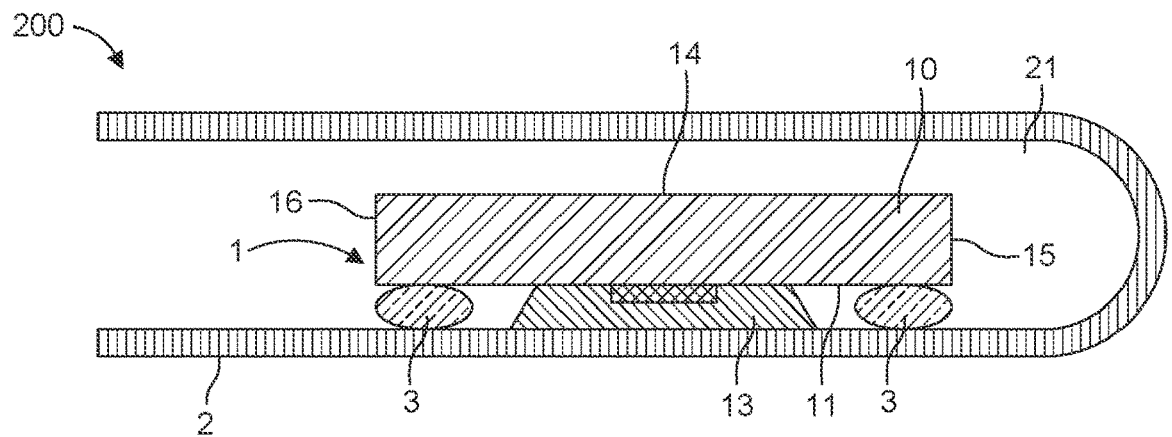
FIGS. 2A-2C show a cross-sectional diagram of a pressure sensor package according to one or more embodiments.
Figure 2B:
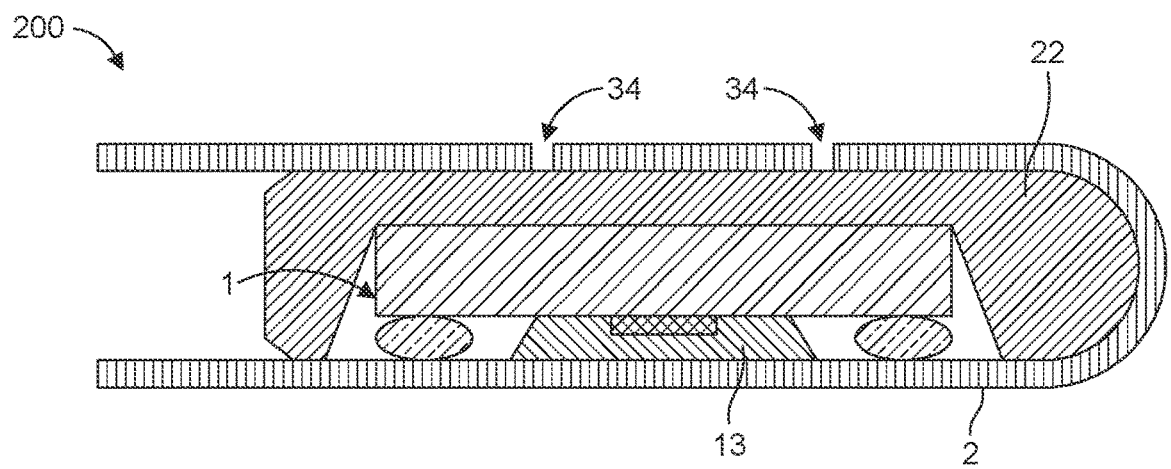
Figure 2C:
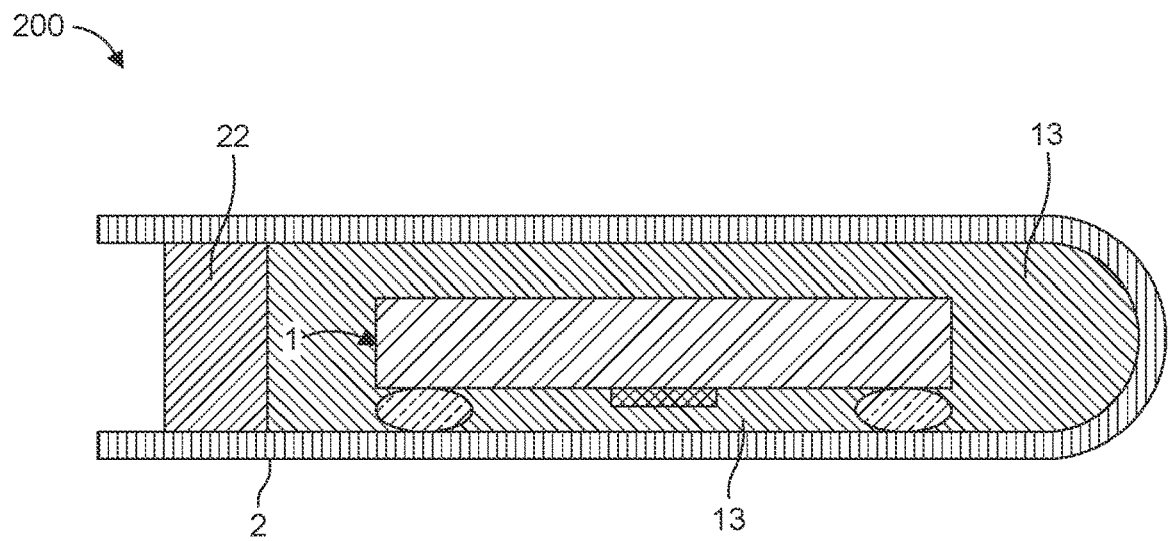

FIGS. 2A-2C show a cross-sectional diagram of a pressure sensor package 200 according to one or more embodiments. Similar to the pressure sensor package 100 shown in FIG. 1, the pressure sensor package 200 includes chip 1 bonded to a flexible carrier 2 by bonding balls 3, with the exception that the flexible carrier 2 is folded around the chip 1 for additional protection. By folding the flexible carrier 2 around the chip 1, a folded pocket 21 or cavity is formed around the chip 1. Thus, the flexible carrier 2 encircles at least three sides of the chip 1, including the main surface 11, a back surface 14 opposite to the main surface 11, and a side surface 15 that adjoins the main surface 11 and the back surface 14.

As shown in FIG. 2B, the folded pocket 21 is at least partially filled with a compressible foam 22 such that a gap between the back surface 14 and the flexible carrier 2 is filled with the foam 22 and such that a gap between the side surface 15 and the flexible carrier 2 is filled with the foam 22. At the very least, the foam 22 should be porous in order for it to forward pressure unchanged to the protective material 13 and be detected by the pressure sensor. The foam 22 may be pressed into the folded pocket 21 for protection and media filtering.

Alternatively, a soft tissue or a mesh of fibers could be used instead of a foam. Thus, any material that is compressible and porous may be used in place of foam 22. This material may be referred to as a filling material that is compressible and porous that is configured to forward pressure unchanged to the protective material 13.

In addition, the foam 22 may cover another side surface 16 of the chip 1 such that the foam 22 encapsulates the chip 1 on all remaining sides of the chip 1, with the exception of the main surface 11. As described above, the flexible protective material 13 is used to fill the gap the main surface 11, including the MEMS element 12, and the flexible carrier 2.

Thus, in one example, the flexible carrier 2 may first be folded over to form the folded pocket 21, and then foam 22 may be injected into the folded pocket 21 to fill the remaining gaps and seal the chip 1, bonding balls 3, and the MEMS element 12.

Alternatively, the foam 22 may be disposed on the chip 1 to encapsulate the exposed surfaces of the chip 1, and then the flexible carrier 2 may be folded over the dispensed foam 22 to form the structure shown in FIG. 2B.

As another alternative, the foam 22 may be glued to the flexible carrier 2 before being folded over the chip 1. Once glued, the flexible carrier 2 and the foam 22 may be folded over the chip 1 to achieve the same result depicted in FIG. 2B.

The flexible carrier 2 may further include one or more pressure openings 34 that extend through the portion of the flexible carrier 2 that is folded over the backside of the chip 1. The pressure openings 34 allow the flexible carrier 2 to be porous so that air pressure can pass therethrough. Thus, the pressure openings 34 serve to dissipate mechanical stress.

As shown in FIG. 2C, the folded pocket 21 is filled with the the flexible protective material 13 in an area that entirely encapsulates the chip 1, including the MEMS element 12. The compressible foam 22 may be further dispensed at a side region of the package 200 to enclose the chip 1 and the flexible protective material 13 within the folded pocket 21. That is a remaining portion of the folded pocket 21 is filled with the foam 22.

Thus, in one example, the flexible carrier 2 may first be folded over to form the folded pocket 21, and then the flexible protective material 13 may be injected into the folded pocket 21 to fill the remaining gaps and seal the chip 1, bonding balls 3, and the MEMS element 12. Subsequently, the foam 22 may then be injected to seal the flexible protective material 13 inside the folded pocket 21.

While not shown, the flexible carrier 2 in FIGS. 2A-2C may further include slits similar to slits 19 shown in FIG. 1.

Alternatively, the flexible protective material 13 may be disposed on the chip 1 to encapsulate the exposed surfaces of the chip 1, and then the flexible carrier 2 may be folded over the dispensed flexible protective material 13 to form the structure shown in FIG. 2C. Subsequently, the foam 22 may then be injected to seal the flexible protective material 13 inside the folded pocket 21.

Figure 3:
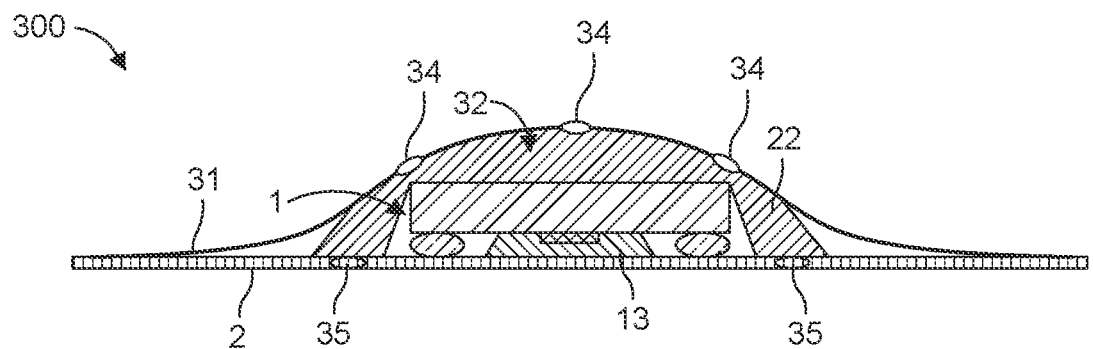
FIG. 3 shows a cross-sectional diagram of a pressure sensor package according to one or more embodiments.

FIG. 3 shows a cross-sectional diagram of a pressure sensor package 300 according to one or more embodiments. Similar to the pressure sensor packages 100 and 200 shown in FIGS. 1 and 2A-2C, the pressure sensor package 300 includes chip 1 bonded to a flexible carrier 2 by bonding balls 3, with the exception that a flexible film sticker 31 is provided over the back side of the chip 1 to form a pocket 32 or cavity in which the chip 1 resides.

In particular, the film sticker 31 may be bonded to the flexible carrier 2 at a perimeter that surrounds the chip 1. Thus, the film sticker 31 extends from a bonded area of the flexible carrier 2 over a back side of the chip 1. A compressible foam 22 may then be injected between an inside surface of the film sticker 31 and the chip 1 such that the foam 22 separates the film sticker 31 from the chip 1. As a result, the pocket 32 is formed or is enlarged by the injection of the foam 22.

Alternatively, the foam 22 may be first disposed on the chip 1 and the flexible carrier 2 to encapsulate the exposed surfaces of the chip 1, and then the film sticker 31 may be placed over the foam 22 and bonded to the flexible carrier 2.

As another alternative, the foam 22 may be glued to the film sticker 31 and then glued over the chip 1. Thus, the film sticker 31 may be glued to the chip 1 via the foam 22 to achieve the result depicted in FIG. 3.

The film sticker 31 may further include one or more pressure openings 34 that extend through the membrane of the film sticker 31. The pressure openings 34 allow the film sticker 31 to be porous so that air pressure can pass therethrough. Thus, the pressure openings 34 serve to dissipate mechanical stress. In addition, it is possible to inject the foam through one or more of the pressure openings 34 to fill the pocket 32.

Similarly, the flexible carrier 2 may include one or more pressure openings 35 that extend through the flexible carrier 2. The pressure openings 35 are located in a region where the foam 22 is in contact with the flexible carrier. It is possible to inject the foam through one or more of the pressure openings 35 to fill the pocket 32. The pressure openings 35 allow the flexible carrier 2 to be porous so that air pressure can pass therethrough. Thus, the pressure openings 35 serve to dissipate mechanical stress.

While not shown, the flexible carrier 2 in FIG. 3 may further include slits similar to slits 19 shown in FIG. 1.

Figure 4:
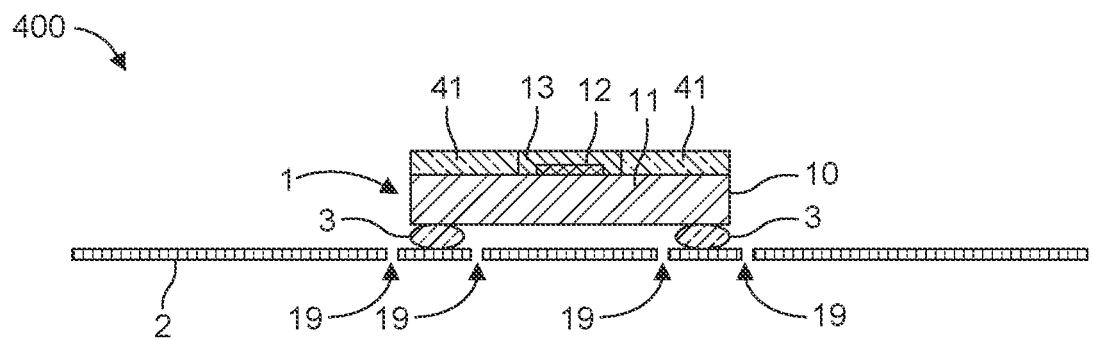
FIG. 4 shows a cross-sectional diagram of a pressure sensor package according to one or more embodiments.

FIG. 4 shows a cross-sectional diagram of a pressure sensor package 400 according to one or more embodiments. Similar to the pressure sensor package 100 shown in FIG. 1, the pressure sensor package 400 includes chip 1 bonded to a flexible carrier 2 by bonding balls 3, with the exception that the bonding balls 3 are coupled to a back surface 14 of the chip 1 and the sensitive area of the MEMS element 12 faces away from the flexible carrier 2. The flexible carrier 2 may further include slits 19.

In addition, the MEMS element 12 is arranged at the main surface 11 of the chip 1 and its exposed surface, including the sensitive area, is completely covered with the flexible protective material 13. The glob of flexible protective material 13 is further surrounded by a structured material 41 that is also disposed on the main surface 11 of the chip 1. Thus, the structured material 41 is disposed around a peripheral region of the main surface 11, while the flexible protective material 13 and the MEMS element 12 are disposed at an inner region of the main surface 11.

The structured material 41 may be a structured synthetic resin, which should be sufficiently flexible to avoid the generation of excessive stress. A resin material that may be used in semiconductor processes is polyimide. The resin provides an opening at an area around the MEMS element 12, which may support a controlled deposition of the flexible protective material 13. Thus, the flexible protective material 13 is dispensed within the opening formed by the structured material 41.

Alternatively, the structured material 41 may be a structured silicon wafer or a structured glass wafer with a thermally adapted expansion coefficient.

Figure 5:
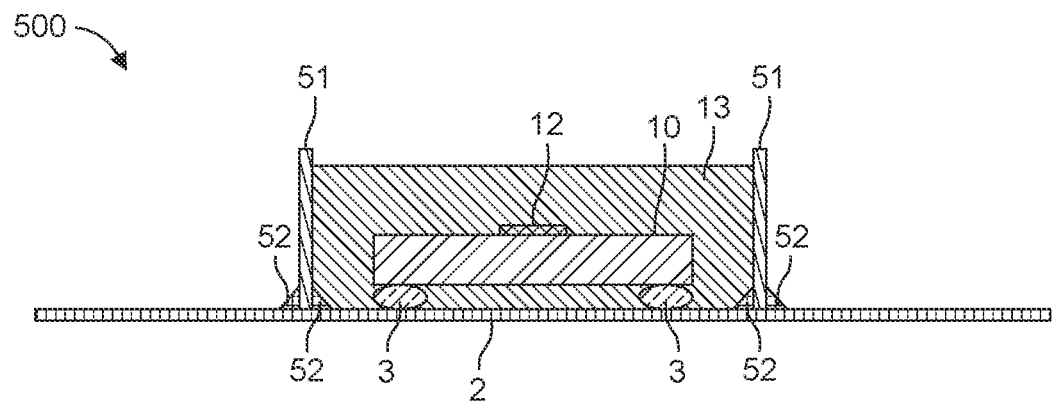
FIG. 5 shows a cross-sectional diagram of a pressure sensor package according to one or more embodiments.

FIG. 5 shows a cross-sectional diagram of a pressure sensor package 500 according to one or more embodiments. Similar to the pressure sensor package 400 shown in FIG. 4, the pressure sensor package 500 includes chip 1 bonded to a flexible carrier 2 by bonding balls 3, with the exception that the flexible protective material 13 completely encapsulates the chip 1, including the MEMS element 12.

In addition, the pressure sensor package 500 includes a boundary frame 51 that is bonding to the flexible carrier 2 with a bonding adhesive 52, such as glue or solder. The boundary frame 51 entirely surrounds a periphery of the chip 1, and the flexible protective material 13 is deposited globally over the chip 1 using the boundary frame 51 to retain the flexible protective material 13 within a cavity that is formed between the walls of the boundary frame 51.

In FIGS. 4 and 5, it will also be appreciated that the flexible carrier 2 may also be folded around the chip 1 to form a folded pocket around the chip in a similar manner described with respect to FIGS. 2A-2C. Thus, FIGS. 4 and 5 may incorporate any of the features described in conjunction with FIGS. 2A-2C.

Similarly, in FIGS. 4 and 5, it will also be appreciated that the film sticker 31 may be bonded to the flexible carrier 2 to enclose the chip 1 within a pocket 32 in a similar manner described with respect to FIG. 3. Thus, FIGS. 4 and 5 may incorporate any of the features described in conjunction with FIG. 3.

Figure 6:
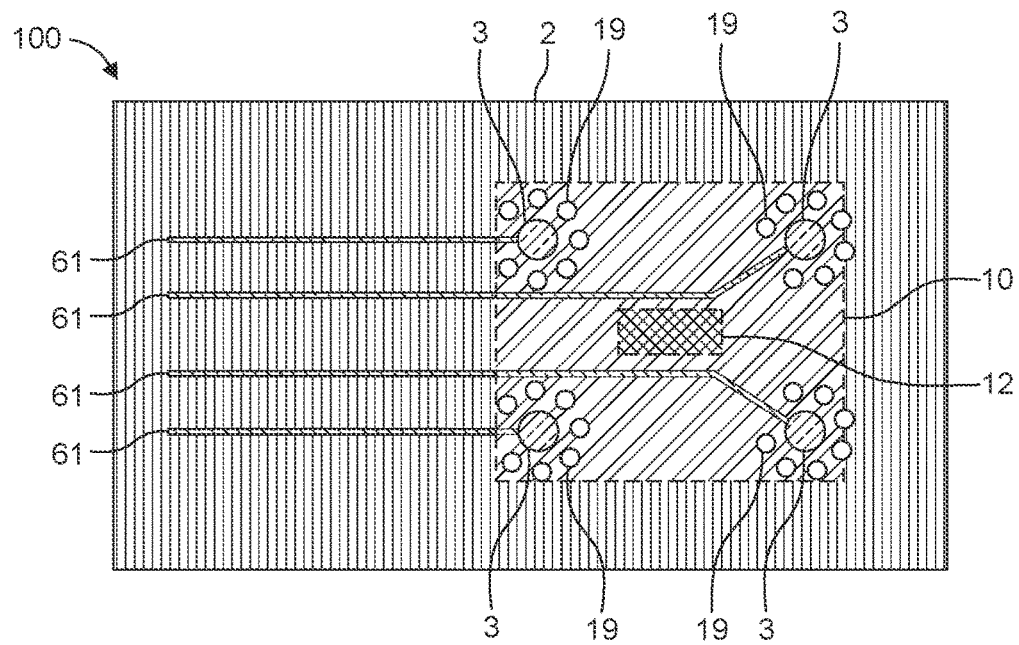
FIG. 6 shows a top view of the pressure sensor package shown in FIG. 1.

FIG. 6 shows a top view of the pressure sensor package 100 shown in FIG. 1. As can be seen, the bonding balls 3 are connected to lead wires 61. Also, slits or openings 19 formed in the flexible carrier 2 are shown. Multiple openings 19 surround a bonding region of the flexible carrier 2 where a respective bonding ball 3 is bonded thereto.

Figure 7:
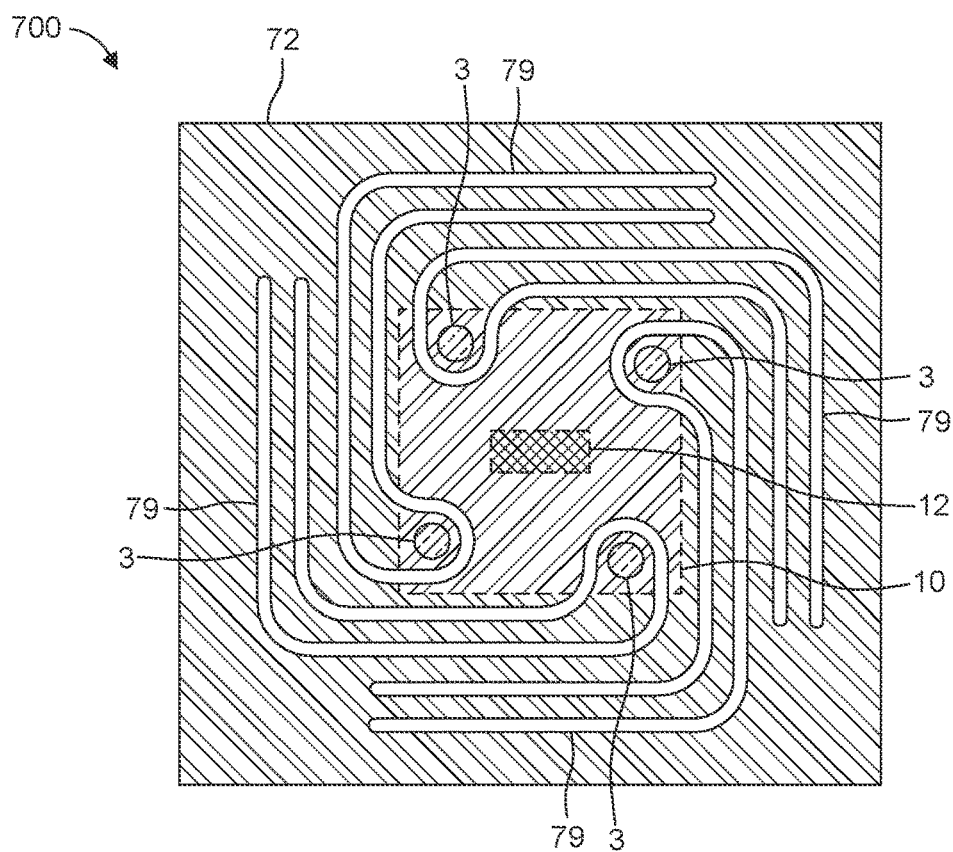
FIG. 7 shows a top view of the pressure sensor package according to one or more embodiments.

FIG. 7 shows a top view of the pressure sensor package 700 according to one or more embodiments. In particular, the pressure sensor package 700 uses a regular PCB 72 made of, for example, FR4 or ceramic material instead of a flexible carrier. In addition, the PCB 72 includes stress relieve springs 79 entrenched in the material of the PCB 72. The stress relieve springs 79 are formed by milling grooves or channels in the PCB 72. Each stress relieve springs 79 can be seen as two parallel channels that join together at the periphery of a corresponding bonding ball 3 to form one single integral channel.

Each channel wraps around a periphery of a corresponding bonding ball 3 and extends outward towards a periphery of the PCB 72. A stress relieve spring 79 may extend from a periphery of a corresponding bonding ball 3 and extend to a periphery of the PCB 72 cattycorner from the corresponding bonding ball 3. For example, one stress relieve spring 79 wraps around the periphery of the bonding ball 3 located at the top left corner of the chip 1, wraps around a periphery of two adjacent sides of the chip 1 towards a lower right corner of the PCB 72.

It will be appreciated that the PCB 72 with stress relieve springs 79 may be implemented in FIGS. 1, 3, 4, and 5, replacing the flexible carrier 2.

Although embodiments described herein relate to MEMS pressure sensors, and, in some cases capacitive pressure sensors, it is to be understood that other implementations may include other types of pressure sensors or other types of MEMS devices or MEMS elements. In addition, although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the method steps may be executed by such an apparatus.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

Furthermore, the description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid in the understanding of the principles of the disclosure and the concepts contributed to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof. Thus, it is understood that modifications and variations of the arrangements and the details described herein will be apparent to others skilled in the art.

Furthermore, the following claims are hereby incorporated into the detailed description, where each claim may stand on its own as a separate example embodiment. While each claim may stand on its own as a separate example embodiment, it is to be noted that—although a dependent claim may refer in the claims to a specific combination with one or more other claims—other example embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

What is claimed is:
1. A semiconductor device, comprising:
   a semiconductor chip comprising a substrate and a microelectromechanical system (MEMS) element, wherein the substrate includes a first surface and a second surface arranged opposite to the first surface, and wherein the MEMS element is disposed at the first surface of the substrate and the MEMS element includes a sensitive area;
a first electrical interconnect structure electrically connected to the first surface of the substrate;
a carrier electrically connected to the first electrical interconnect structure; and
a first stress relieve spring entrenched in the carrier, wherein the first stress relieve spring is a single integral channel that comprises two parallel channels that join together at a periphery of the first electrical interconnect structure to form the single integral channel that wraps around a portion of the periphery of the first electrical interconnect structure, wherein the two parallel channels extend outward, in parallel, from the periphery of the first electrical interconnect structure to a first termination region of the carrier.

2. The semiconductor device of claim 1, wherein:
the substrate of the semiconductor chip is rectangular,
the first electrical interconnect structure is electrically connected at a first corner region of the first surface of the substrate, and
the two parallel channels extend, in parallel, outward from the periphery of the first electrical interconnect structure such that they wrap around two adjacent sides of the substrate and terminate at the first termination region that is located cattycorner from the first electrical interconnect structure.

3. The semiconductor device of claim 1, wherein:
the substrate of the semiconductor chip is rectangular,
the two parallel channels extend, in parallel, outward from the periphery of the first electrical interconnect structure to the first termination region of the carrier located at a first periphery region of the carrier, wherein the first periphery region of the carrier is located cattycorner to the first electrical interconnect structure.

4. The semiconductor device of claim 1, wherein the MEMS element is interposed along a diagonal that extends between the first termination region and the first electrical interconnect structure.

5. The semiconductor device of claim 1, wherein the single integral channel of the first stress relieve spring extends entirely through a thickness dimension of the carrier.

6. The semiconductor device of claim 1, wherein the first termination region of the carrier is located at a first periphery region of the carrier.

7. The semiconductor device of claim 1, wherein the first electrical interconnect structure is a bonding ball.

8. The semiconductor device of claim 1, wherein the carrier is a printed circuit board.

9. The semiconductor device of claim 1, wherein:
the MEMS element is a pressure sensor and the sensitive area is a pressure sensitive membrane that is separated from the carrier by a gap, and
the semiconductor device further comprising a flexible protective material that extends from the carrier to the pressure sensitive membrane, thereby filling the gap between the pressure sensitive membrane and the carrier such that the pressure sensitive membrane is encapsulated by the flexible protective material.

10. The semiconductor device of claim 9, wherein:
the flexible protective material is configured to receive applied pressure and transfer the received applied pressure therethrough to the pressure sensitive membrane unchanged.

11. The semiconductor device of claim 1, wherein the single integral channel partially encircles a first contact area of the carrier at which the first electrical interconnect structure is electrically connected thereto.

12. The semiconductor device of claim 11, wherein a portion of the single integral channel that partially encircles the first contact area of the carrier is concentric with the first electrical interconnect structure.

13. The semiconductor device of claim 1, further comprising:
a second electrical interconnect structure electrically connected to the first surface of the substrate and to the carrier; and
a second stress relieve spring entrenched in the carrier, wherein the second stress relieve spring is a single integral channel that comprises two parallel channels that join together at a periphery of the second electrical interconnect structure to form the single integral channel that wraps around a portion of the periphery of the second electrical interconnect structure, wherein the two parallel channels extend outward, in parallel, from the periphery of the second electrical interconnect structure to a second termination region of the carrier.

14. The semiconductor device of claim 13, wherein a portion of the two parallel channels of the first stress relieve spring are parallel with a portion of the two parallel channels of the second stress relieve spring.

15. The semiconductor device of claim 13, wherein:
the first electrical interconnect structure is electrically connected at a first corner region of the first surface of the substrate and the two parallel channels of the first stress relieve spring extend, in parallel, outward from the periphery of the first electrical interconnect structure such that they wrap around a first two adjacent sides of the substrate and terminate at the first termination region that is located cattycorner from the first electrical interconnect structure, and
the second electrical interconnect structure is electrically connected at a second corner region of the first surface of the substrate and the two parallel channels of the second stress relieve spring extend, in parallel, outward from the periphery of the second electrical interconnect structure such that they wrap around a second two adjacent sides of the substrate and terminate at the second termination region that is located cattycorner from the second electrical interconnect structure.

16. The semiconductor device of claim 15, wherein the MEMS element is interposed along a first diagonal that extends between the first termination region and the first electrical interconnect structure and is interposed along a second diagonal that extends between the second termination region and the second electrical interconnect structure.

17. The semiconductor device of claim 16, wherein the first diagonal and the second diagonal extend diagonally across the semiconductor chip.

18. The semiconductor device of claim 13, further comprising:
a third electrical interconnect structure electrically connected to the first surface of the substrate and to the carrier; and
a third stress relieve spring entrenched in the carrier, wherein the third stress relieve spring is a single integral channel that comprises two parallel channels that join together at a periphery of the third electrical interconnect structure to form the single integral channel that wraps around a portion of the periphery of the third electrical interconnect structure, wherein the two parallel channels extend outward, in parallel, from the periphery of the third electrical interconnect structure to a third termination region of the carrier.

19. The semiconductor device of claim 18, further comprising:
a fourth electrical interconnect structure electrically connected to the first surface of the substrate and to the carrier; and
a fourth stress relieve spring entrenched in the carrier, wherein the fourth stress relieve spring is a single integral channel that comprises two parallel channels that join together at a periphery of the fourth electrical interconnect structure to form the single integral channel that wraps around a portion of the periphery of the fourth electrical interconnect structure, wherein the two parallel channels extend outward, in parallel, from the periphery of the fourth electrical interconnect structure to a fourth termination region of the carrier.

20. The semiconductor device of claim 19, wherein:
the first electrical interconnect structure is electrically connected at a first corner region of the first surface of the substrate and the two parallel channels of the first stress relieve spring extend, in parallel, outward from the periphery of the first electrical interconnect structure such that they wrap around a first two adjacent sides of the substrate and terminate at the first termination region that is located cattycorner from the first electrical interconnect structure,
the second electrical interconnect structure is electrically connected at a second corner region of the first surface of the substrate and the two parallel channels of the second stress relieve spring extend, in parallel, outward from the periphery of the second electrical interconnect structure such that they wrap around a second two adjacent sides of the substrate and terminate at the second termination region that is located cattycorner from the second electrical interconnect structure,
the third electrical interconnect structure is electrically connected at a third corner region of the first surface of the substrate and the two parallel channels of the third stress relieve spring extend, in parallel, outward from the periphery of the third electrical interconnect structure such that they wrap around a third two adjacent sides of the substrate and terminate at the third termination region that is located cattycorner from the third electrical interconnect structure, and
the fourth electrical interconnect structure is electrically connected at a fourth corner region of the first surface of the substrate and the two parallel channels of the fourth stress relieve spring extend, in parallel, outward from the periphery of the fourth electrical interconnect structure such that they wrap around a fourth two adjacent sides of the substrate and terminate at the fourth termination region that is located cattycorner from the fourth electrical interconnect structure.

* * * * *